(12) United States Patent
Holmes et al.

(10) Patent No.: US 7,387,974 B2
(45) Date of Patent: Jun. 17, 2008

(54) METHODS FOR PROVIDING GATE CONDUCTORS ON SEMICONDUCTORS AND SEMICONDUCTORS FORMED THEREBY

(75) Inventors: Steven J. Holmes, Guilderland, NY (US); Toshiharu Furukawa, Essex Junction, VT (US); Charles W. Koburger, III, Delmar, NY (US); David V. Horak, Essex Junction, VT (US); Mark C. Hakey, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 10/906,876

(22) Filed: Mar. 10, 2005

(65) Prior Publication Data

US 2006/0202239 A1  Sep. 14, 2006

(51) Int. Cl.
*H01L 21/31* (2006.01)

(52) U.S. Cl. ............... 438/780; 438/535; 438/782; 257/288; 257/618

(58) Field of Classification Search ............... 438/780, 438/585, 782; 257/288, 618
See application file for complete search history.

(56) References Cited

U.S. PATENT DOCUMENTS 6,989,308 B2 * 1/2006 Furukawa et al. .......... 438/283
2003/0113970 A1   6/2003 Fried et al.

OTHER PUBLICATIONS

U.S. Appl. No. 10/906,881, Title: Methods For Metal Plating Of Gate Conductors And Semiconductors Formed Thereby Applicant(s): Holmes, et al. filed Mar. 10, 2005.
Prosecution history of U.S. Appl. No. 10/908,881.

* cited by examiner

*Primary Examiner*—Carl Whitehead, Jr.
*Assistant Examiner*—Colleen E Rodgers
(74) *Attorney, Agent, or Firm*—Ohlandt, Greeley, Ruggiero & Perle, L.L.P.; Steven Capella, Esq.

(57) ABSTRACT

A method of providing a gate conductor on a semiconductor is provided. The method includes defining an organic polymer plating mandrel on the semiconductor, activating one or more sites of the organic polymer plating mandrel, binding a seed layer to the activated sites, and plating the dummy gate on the seed layer. The dummy gate defines a location for the gate conductor. Semiconductor devices having a dummy gate plated thereon to a width of between about 10 to about 70 nanometers are also provided.

16 Claims, 14 Drawing Sheets

METHODS FOR PROVIDING GATE CONDUCTORS ON SEMICONDUCTORS AND SEMICONDUCTORS FORMED THEREBY

CROSS REFERENCE TO RELATED APPLICATION

The present disclosure is related to U.S. application Ser. No. 10/906,881 filed on Mar. 10, 2005, which issued as U.S. Pat. No. 7,229,889 on Jun. 12, 2007, the contents of which are incorporated by reference herein.

BACKGROUND OF THE INVENTION

The present disclosure relates generally to the field of semiconductor manufacturing. More particularly, the present disclosure relates to methods for replacing a plated metal dummy gate with gate conductors, as well as semiconductors formed thereby.

The continuing push for high performance and high density in the ultra large scale integrated circuits (ULSI) industry demands new device technologies to scale device dimension and new methods for manufacturing the new devices.

For example, the demand for increased device performance is particularly strong in the design and fabrication of field effect transistors (FET's). However, scaling FET's to attain higher device performance and density can increase the cost and difficulty of many manufacturing steps.

One type of FET that has been proven to provide increased device performance is a fin Field Effect Transistor ("finFET"). In a finFET, the body of the transistor is formed from a vertical structure, generally referred to as a "fin". The gate conductors of the finFET are then formed on one or more sides of the fin. Unfortunately, the formation of gate conductors on the vertical fin has proven increasingly difficult as the density of the finFET technology is increased. For example, the formation of gate conductors on the vertical fin requires a specially optimized lithography and etching to define the gate, which have proven difficult and/or expensive in many manufacturing processes.

Accordingly, it has been determined by the present disclosure that there is a need for methods of producing new semiconductor device features that overcome, mitigate, and/ or avoid one or more of the aforementioned drawbacks and deficiencies of the prior art.

BRIEF DESCRIPTION OF THE INVENTION

Methods for providing dummy gates for replacement gates on semiconductors are provided.

Semiconductor FET devices having conductive gates are also provided.

In one embodiment, a method of providing a gate conductor on a semiconductor is provided. The method includes defining an organic polymer plating mandrel on the semiconductor, activating one or more sites of the organic polymer plating mandrel, binding a seed layer to the one or more sites, and plating the dummy gate on the seed layer. The dummy gate defines a location for the gate conductor.

In other embodiments, a method of providing a gate conductor on a fin of a field effect transistor is provided. The method includes defining an organic polymer mandrel over the semiconductor fin, activating a plurality of sites of the organic polymer mandrel, binding a plating seed layer to plurality of sites, plating a dummy gate to the plating seed layer, the dummy gate defining a location for the gate conductor, and replacing the dummy gate with the gate conductor.

In still other embodiments, a structure for making a field effect transistor is provided. The structure includes a silicon dioxide layer, a silicon fin extending from silicon dioxide layer in a substantially orthogonal direction, and at least one dummy gate on the silicon fin. The dummy gate has a width of between about 10 to about 70 nanometers.

The above-described and other features and advantages of the present disclosure will be appreciated and understood by those skilled in the art from the following detailed description, drawings, and appended claims.

DETAILED DESCRIPTION OF THE INVENTION

Figure 1:
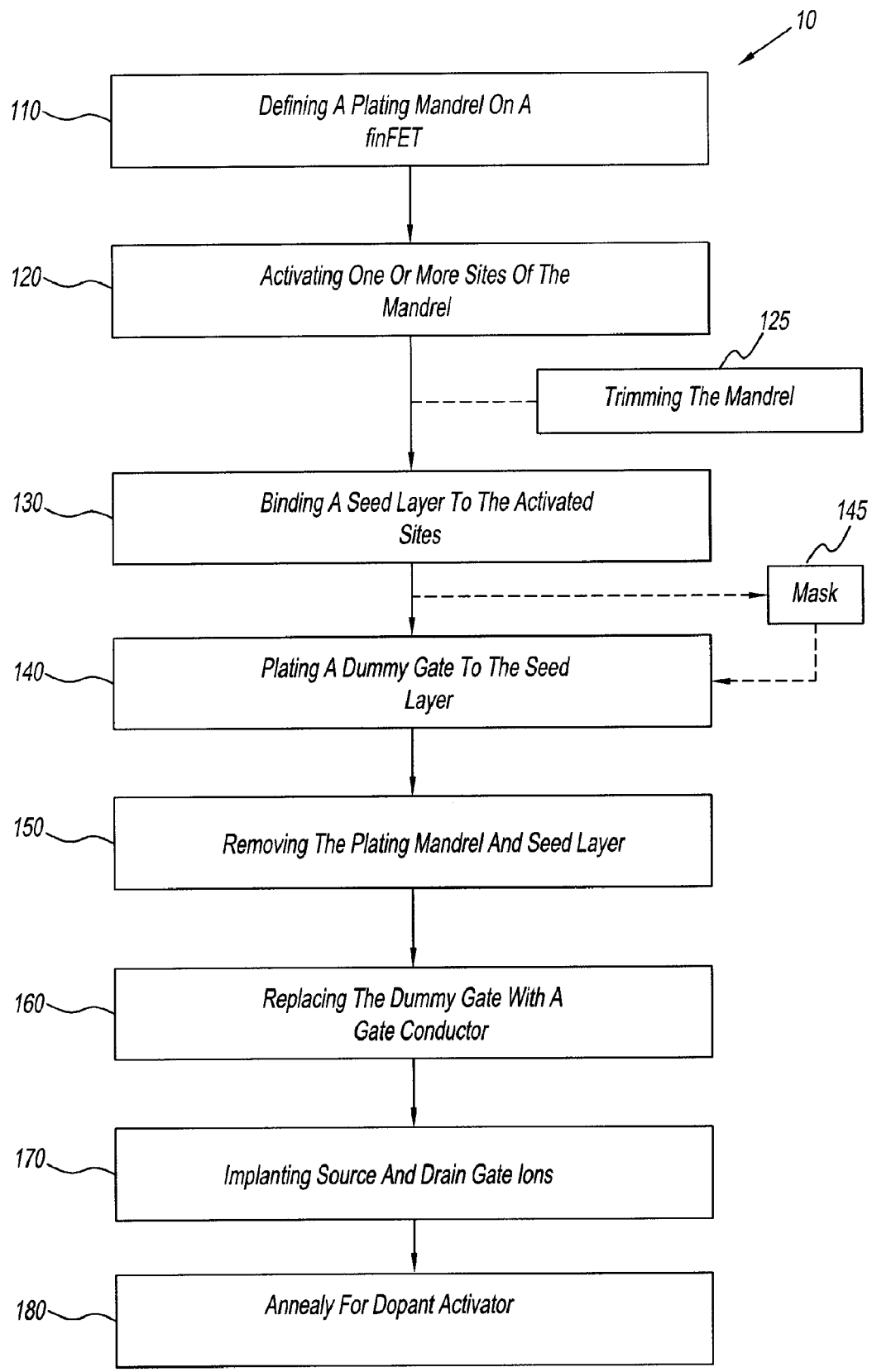
FIG. 1 is a schematic view of an exemplary embodiment of a plating method according to the present invention.

An exemplary embodiment of a plating method according to the present disclosure is generally referred to herein by way of reference numeral 10. For purposes of clarity, method 10 is shown and described herein plating a dummy gate extending outward from a vertical surface of fin Field Effect Transistor ("finFET").

Of course, it is contemplated by the present disclosure for method 10 to find use with other semiconductor devices such as, but not limited to, planar FET's and/or other planar or non-planar integrated circuit devices.

Advantageously, method 10 provides a dummy metallic gate on the fin of the finFET. An exemplary embodiment of method 10 is illustrated schematically in FIG. 1. In a first step 110, method 10 defines a mandrel on a fin structure so that the mandrel extends in a direction substantially perpendicular to the fin. Method 10 then activates one or more sites of the mandrel in a second or activating step 120. Method 10 binds a seed layer to the active sites in a third or seeding step 130 and plates a dummy gate on the seed layer in a fourth step 140. Once the dummy gate is plated on the mandrel, method 10 then removes the mandrel and seed layer in a fifth step 150, leaving the dummy gate in the desired location on the fin.

Method 10 then form a mold about the dummy gate, strips the dummy gate, forms gate dielectric, and fills in the area left behind with the gate conductor in a sixth step 160. After the gate conductor is formed, method 10 then implants source and drain dopants in the exposed silicon fin area in a seventh step 170. Next, method 10 activates the dopants with a high temperature-anneal process during a seventh step 170.

In some embodiments of the present disclosure, method 10 can include a trimming step 125, where the mandrel is trimmed after the activating step 120 but prior to the seeding step 130.

Method 10 provides gate conductors having a smaller width and a width that is better controlled than possible with gate conductors formed by conventional lithography-and-etch techniques.

For example, method 10 can also provide gate conductors having a narrower width than possible with the gate conductors formed by conventional lithography-and-etch techniques. For example, method 10 can form a gate conductor line to a width of about 10 to about 70 nm, preferably to a width of between about 30 to about 50 nm, and any sub-ranges therebetween.

In addition, method 10 can form the gate conductor so that the width varies less than 2 nm from a desired width, preferably less than about 1 nm. It is desired for all of the gate conductors on an integrated circuit device to have widths close to one another so that all of the devices perform at the exact predicted speed (e.g., timing circuits). Accordingly, method 10 can provide integrated circuit devices having circuits performing at substantially higher performance by providing multiple gate conductors that have widths that varies less than about 2 nm from each other, preferably less than about 1 nm.

The steps of plating method 10 are shown and described in further detail with sequential reference to FIGS. 2 through 27.

Figure 2:
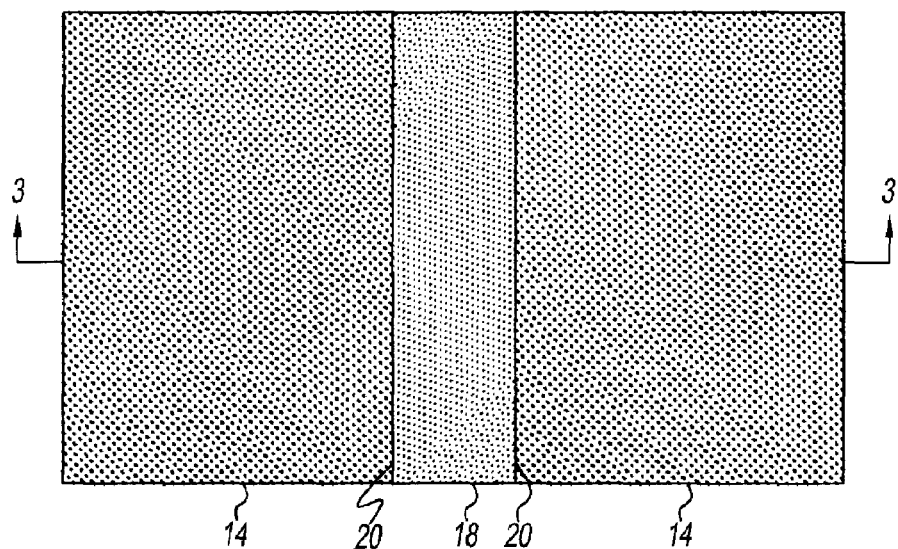
FIG. 2 is a top view of a fin structure prior to modification.
Figure 3:
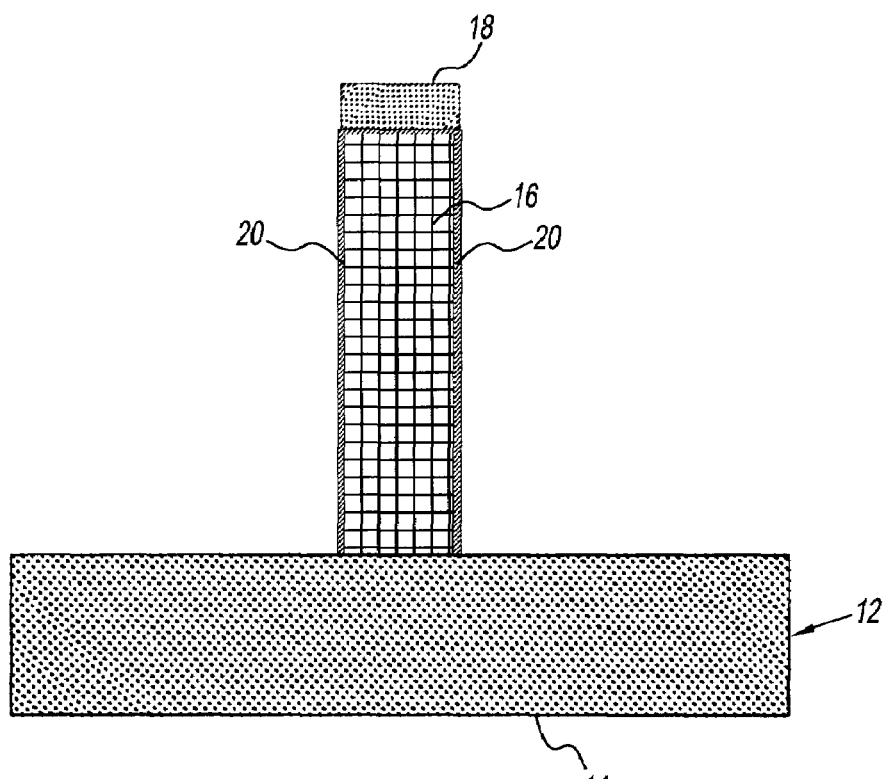
FIG. 3 is a sectional view of FIG. 2, taken along lines 3-3.

Beginning with FIGS. 2 and 3, a fin structure 12 prior to commencement of method 10 is shown. The fin structure 12 has a silicon dioxide layer 14, a silicon fin 16, and a silicon nitride mask 18. Fin 16 extends from silicon dioxide layer 14 in a substantially orthogonal direction. Mask 18 extends from an upper extent of fin 16 opposite silicon dioxide layer 14. The fin structure 12 can be etched using any conventional process for providing fins 16 on silicon dioxide layer 14. The fin structure 12 can also include a sacrificial oxide layer 20 on exposed surfaces of fin 16. Sacrificial oxide layer 20 can be thermally grown or deposited on fin 16 using conventional processes.

Figure 4:
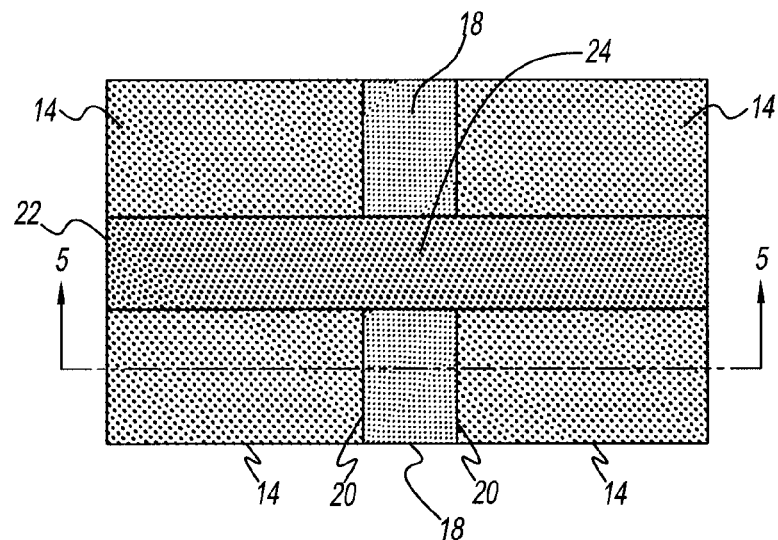
FIG. 4 is a top view of the fin structure after having an organic mandrel applied.
Figure 5:
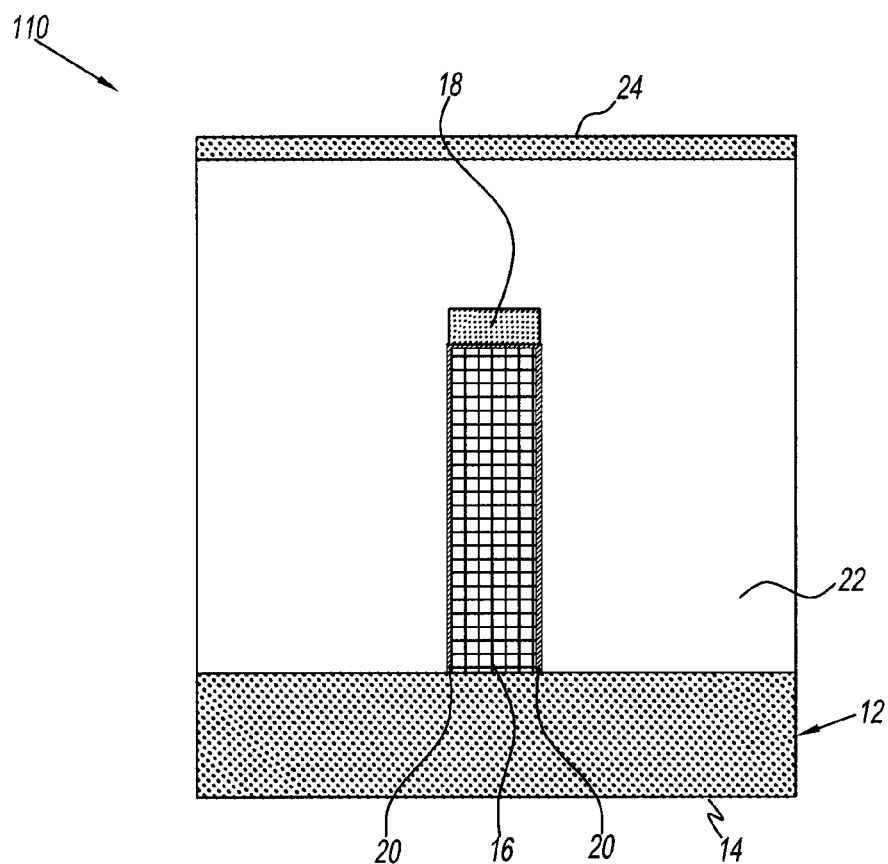
FIG. 5 is a sectional view of FIG. 4, taken along lines 5-5.

In first step 110, method 10 defines a mandrel 22 over silicon dioxide layer 14 and fin 16 as shown in FIGS. 4 and 5. Mandrel 22 is, preferably, made of an organic polymer such as, but not limited to a maleic anhydride polymer or copolymer. In an exemplary embodiment, method 10 spin coats fin structure 12 with a solution of solvent and organic polymer and then bakes the coated fin structure to remove the solvent, leaving baked mandrel material over silicon dioxide layer 14, fin 16, mask 18, and sacrificial oxide layer 20.

Once the baked mandrel material is formed on fin structure 12, method 10 then deposits a cap layer 24 on top of the baked mandrel material. Cap layer 24 can be formed of a silicon dioxide material deposited using any known technique such as, but not limited to, a spin-application process, or plasma assisted CVD.

Method 10 then etches one or more portions of cap layer 24 and mandrel material to leave mandrel 22, best seen in FIG. 5. In the illustrated embodiment, mandrel 22 is defined substantially orthogonal to silicon dioxide layer 14 and fin 16. Advantageously, mandrel 22 assists method 10 in plating a dummy gate on fin 16 as described in detail below.

Figure 6:
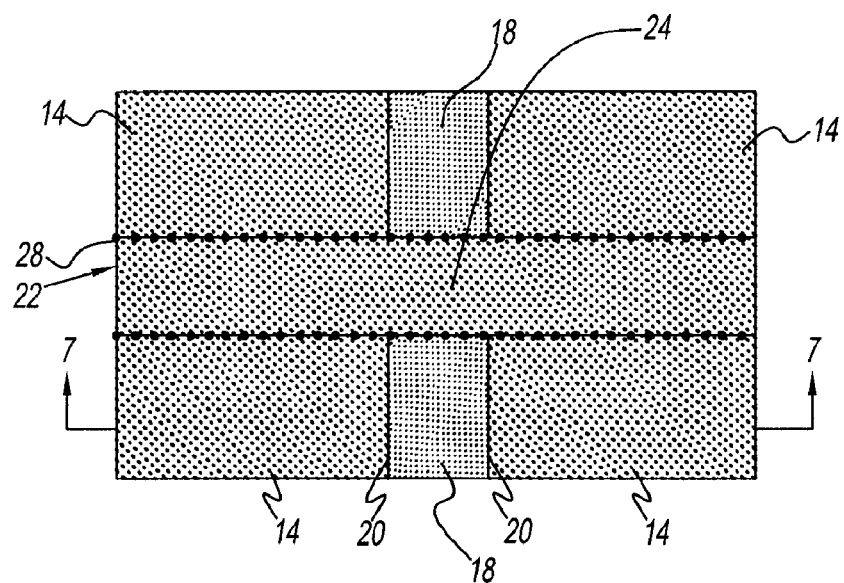
FIG. 6 is a top view of the fin structure after activation of the organic mandrel.
Figure 7:
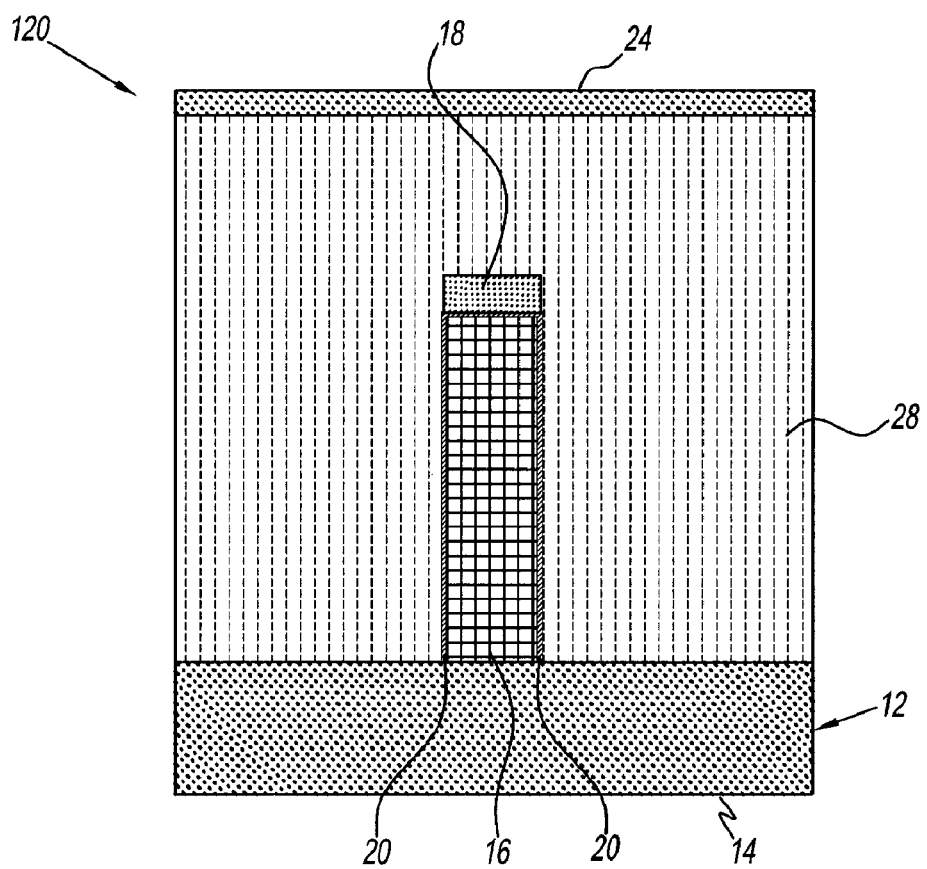
FIG. 7 is a sectional view of FIG. 6, taken along lines 7-7.

In second step 120, method 10 activates the organic polymer of mandrel 22 to provide a plurality of active sites 28 as illustrated in FIGS. 6 and 7. As used herein the term "active site" shall mean a site of the organic polymer of mandrel 22 that has been treated so that that site is receptive to binding metallic ions from the aqueous solution of a metallic salt. It is contemplated by the present disclosure for active sites 28 to be defined by known methods. For example, mandrel 22 can be treated with an ammonia plasma to create amine reactive sites 28 on the organic polymer. In another example, mandrel 22 can be treated with oxygen plasma, sulfuric acid, or peroxide wet acid to create carboxylic acid functional sites 28 on the organic polymer. In yet another example, mandrel 22 can be treated with maleic anhydride with amines or polyfunctional amines, as a vapor or in a solution.

Figure 8:
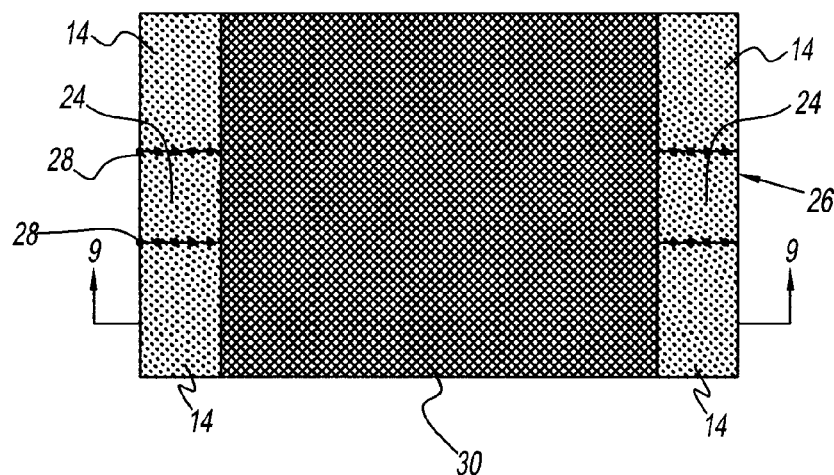
FIG. 8 is a top view of the fin structure after a photoresist is applied, exposed and developed.
Figure 9:
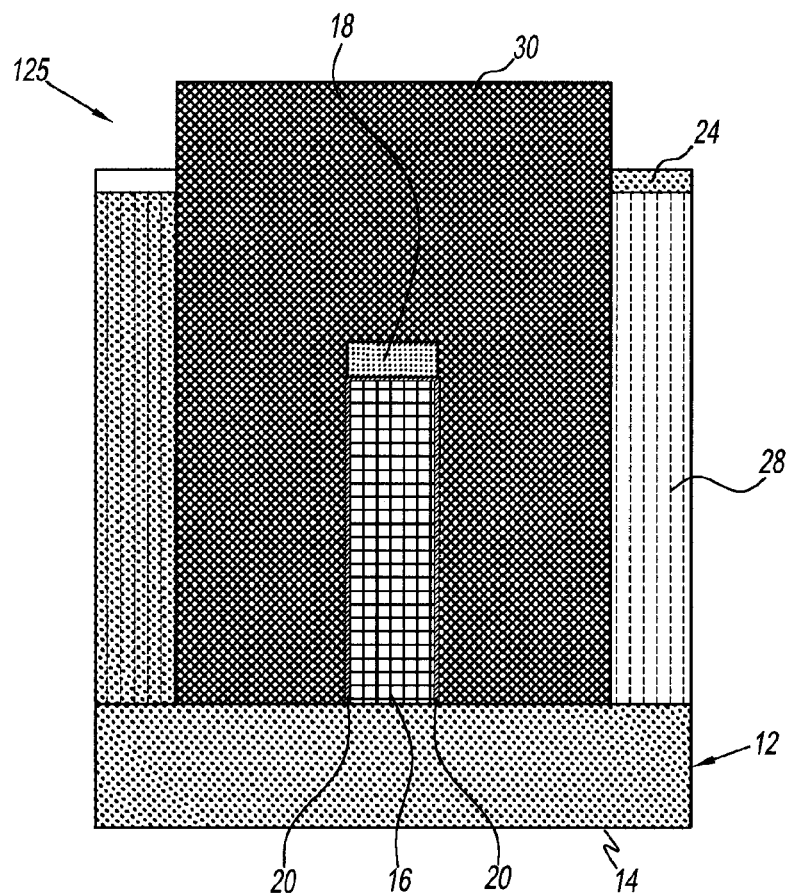
FIG. 9 is a sectional view of FIG. 8, taken along lines 9-9.
Figure 10:
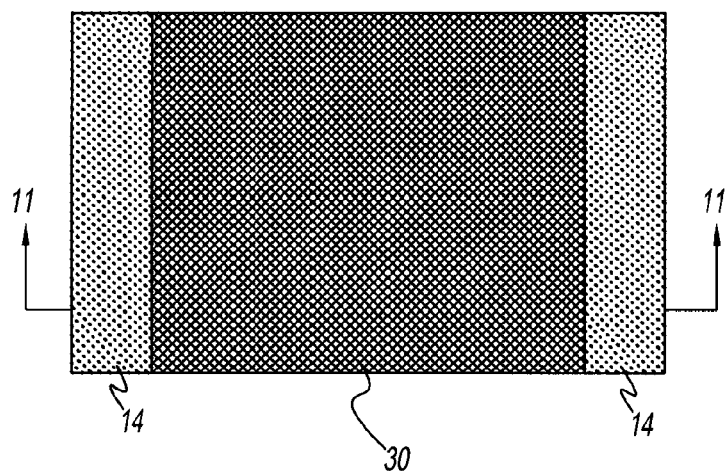
FIG. 10 is a top view of the fin structure after trimming.
Figure 11:
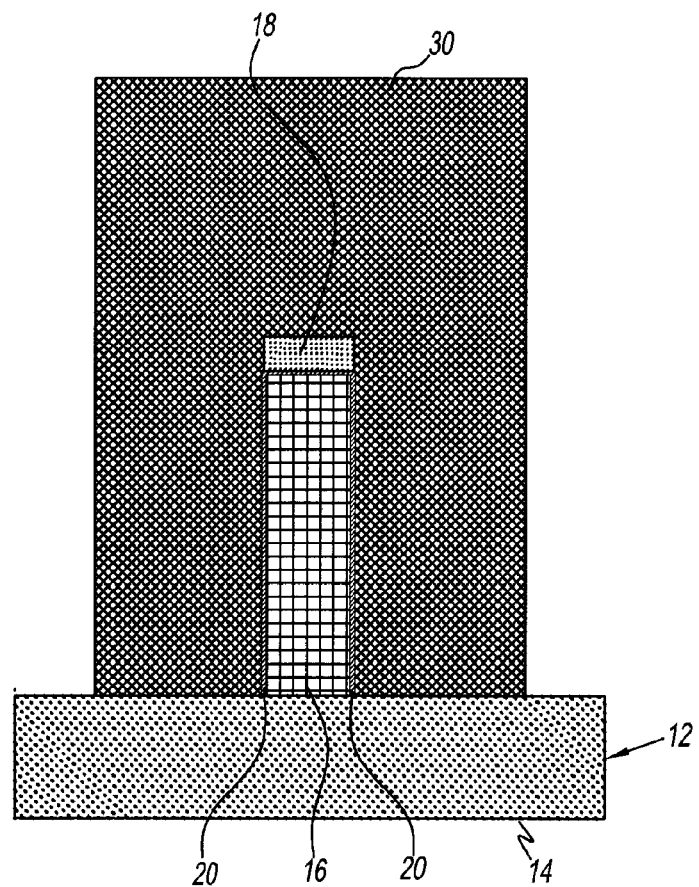
FIG. 11 is a sectional view of FIG. 10, taken along lines 11-11.
Figure 12:
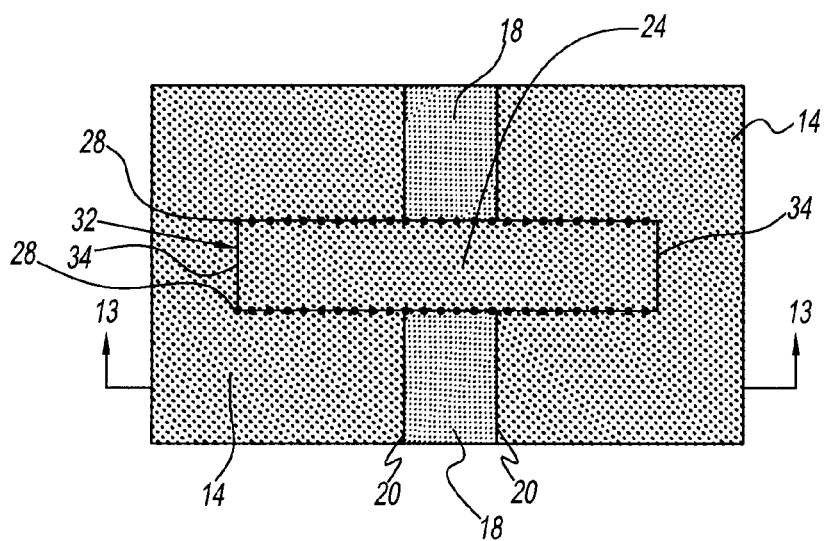
FIG. 12 is a top view of the fin structure after removal of the trim photoresist.
Figure 13:
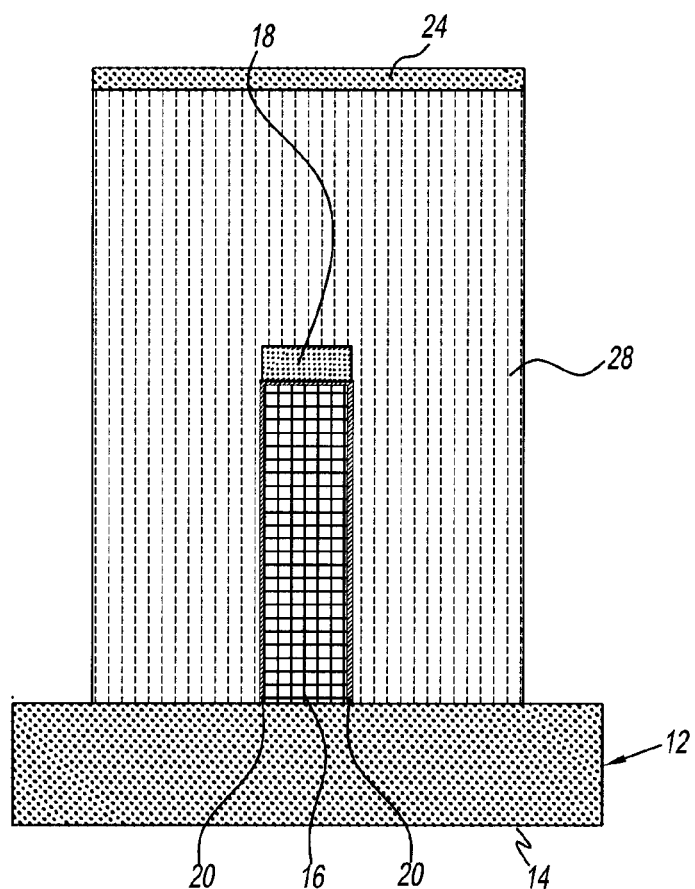
FIG. 13 is a sectional view of FIG. 12, taken along lines 13-13.

In some embodiments of the present disclosure, method 10 can include trimming step 125 shown in FIGS. 8 through 13 to trim mandrel 22 to a desired shape using, for example, known photolithography techniques. For example, method 10 can form a photoresist 30 on one or more desired locations of fin structure 12 as shown in FIGS. 8 and 9. Method 10 then exposes fin structure 12 so that those portions of mandrel 22 that are not covered with photoresist 30 are removed by etching as shown in FIGS. 10 and 11. Next, method 10 removes photoresist 30 to leave a trimmed mandrel 32 as seen in FIGS. 12 and 13.

In the embodiment having trimming step 125, trimmed mandrel 32 now includes one or more surfaces 34 that lack active sites 28. In the illustrated embodiment, surfaces 34 are shown at the outer ends of trimmed mandrel 32.

Figure 14:
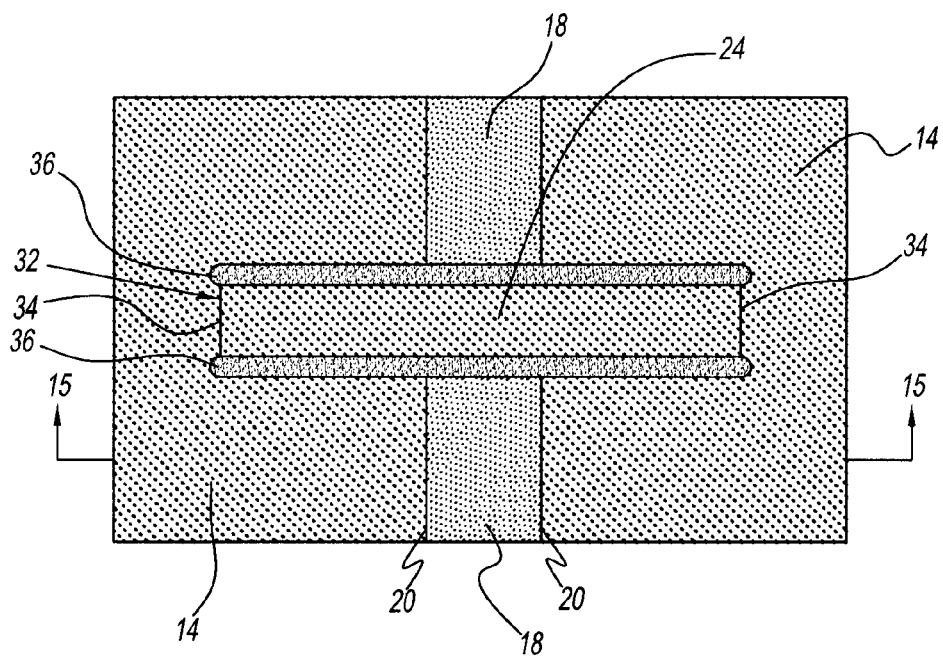
FIG. 14 is a top view of the fin structure after forming a seed layer onto active sites of the mandrel.
Figure 15:
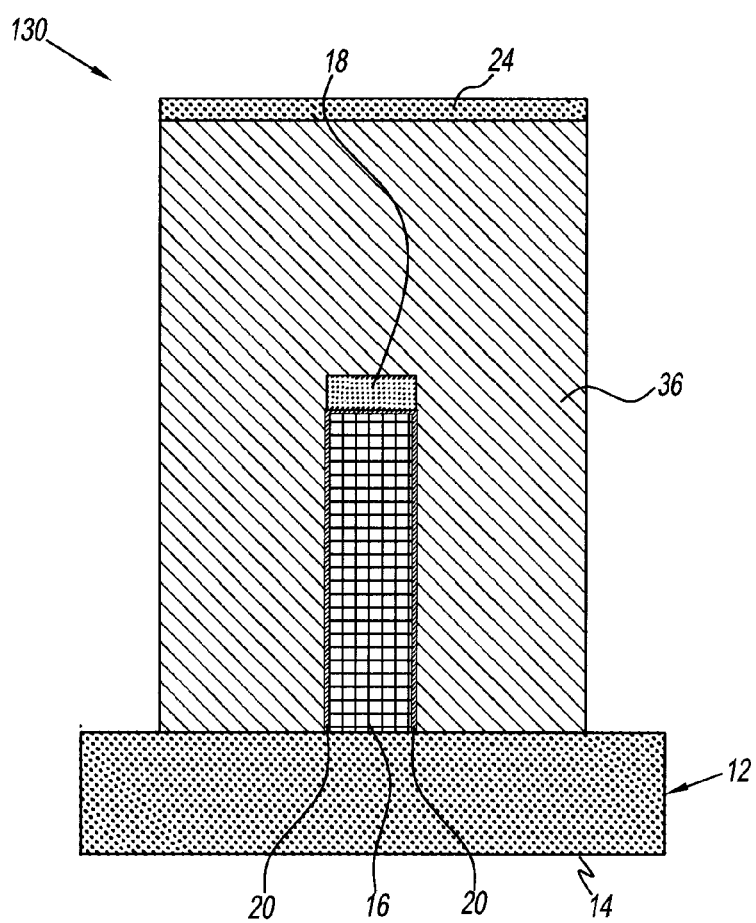
FIG. 15 is a sectional view of FIG. 14, taken along lines 15-15.

Method 10 then binds a plating seed layer 36 to sites 28 of trimmed mandrel 32 during seeding step 130 as shown in FIGS. 14 and 15. In one exemplary embodiment of a seeding step, method 10 can dip fin structure 12 in an aqueous platinum chloride solution so that the platinum ions bind to amine reactive sites 28 on the organic polymer of trimmed mandrel 32. Here, seed layer 36 is not deposited on surfaces 34 or cap layer 24 as these surfaces lack active sites 28 as discussed above. In the illustrated embodiment, method 10 defines two seed layers 36.

Method 10 can then reduce the metal ions present in seed layer 36 to a metallic seed layer. Method 10 can reduce seed layer 36 using any known reduction process. For example, where seed layer 36 is bound using an aqueous platinum chloride solution bound to amine reactive sites 28, method 10 can reduce the seed layer by exposing fin structure 12 to hydrogen gas at a temperature of about 25 degrees Celsius for about 1 minute to 30 minutes.

Figure 16:
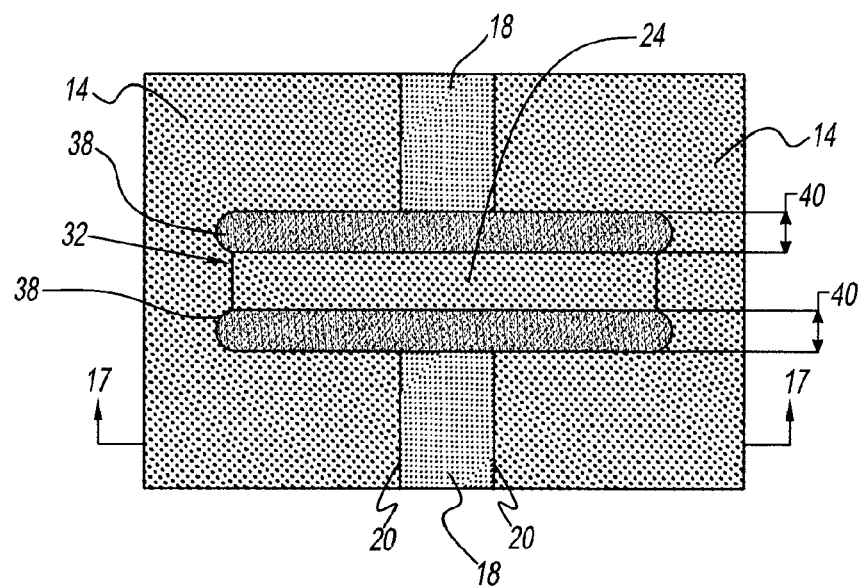
FIG. 16 is a top view of the fin structure after plating a dummy gate conductor on the seed layer.
Figure 17:
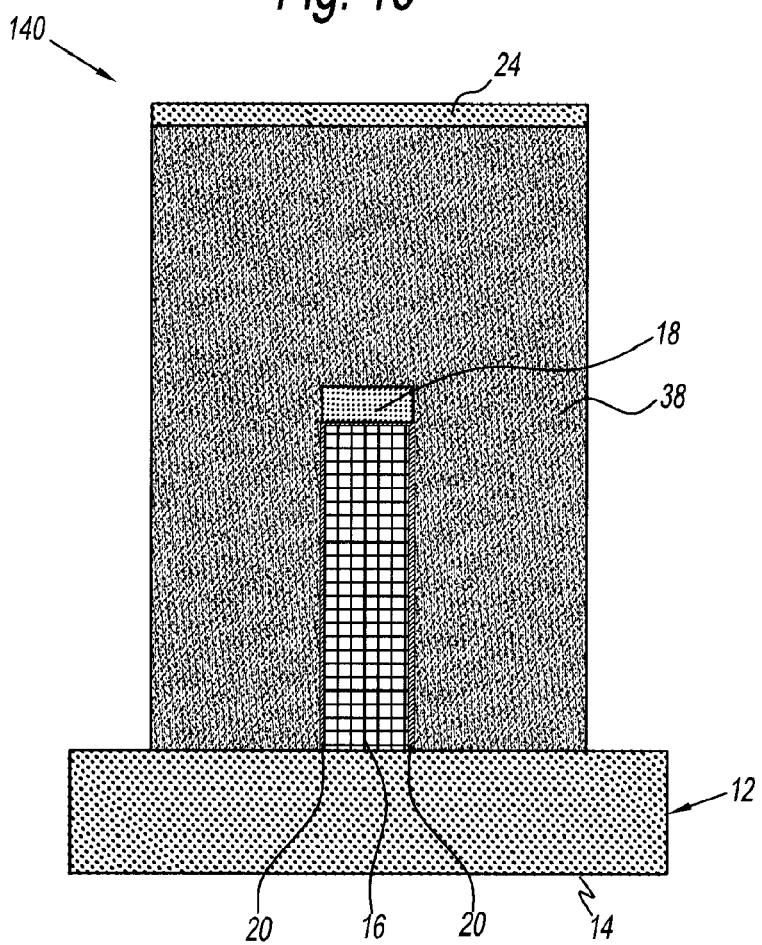
FIG. 17 is a sectional view of FIG. 16, taken along lines 17-17.

Referring now to FIGS. 16 and 17, method 10 includes plating step 140 where a metallic dummy gate 38 is plated on seed layer 36 using known selective plating techniques. Method 10 can subsequently strip dummy gate 38 and replace the dummy gate with a gate conductor as will be described in detail below.

Method 10 can also include one or more masking steps 145 for masking seed layer 36 in conjunction with the plating of dummy gate 38 to the seed layer. In this manner, the masking 145 and plating 140 steps can be repeated as needed to provide fin structure 12 with dummy gate 38 having different widths, for example, for PFET and NFET.

Advantageously, method 10 plates dummy gate 38 that, once replaced with a gate conductor, provides a gate conductor having a width that is narrower and better controlled than possible with gate conductors defined by conventional lithography and etch. For example, method 10 can plate two or more dummy gates 38 having a width 40 of about 10 to about 70 nm where the width of the dummy gate vary less than about 2 nm from each other, preferably less than about 1 nm.

Figure 18:
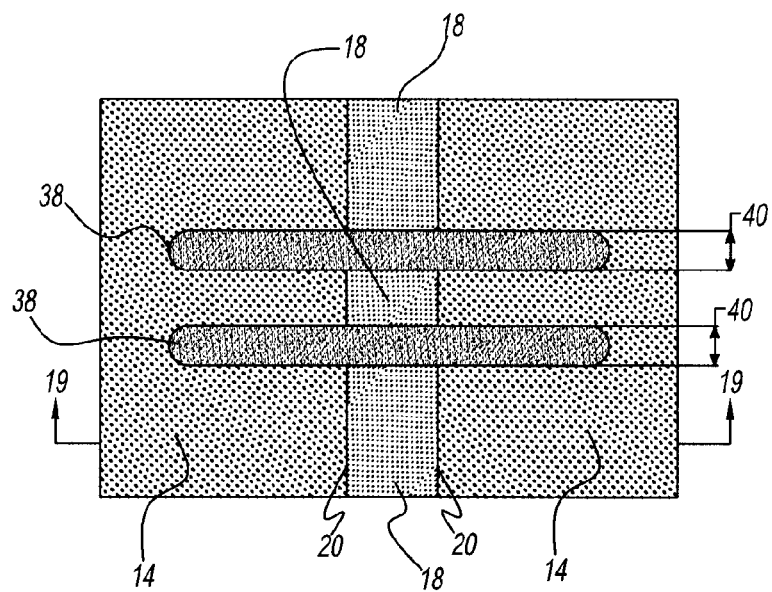
FIG. 18 is a top view of the fin structure after removal of the mandrel.
Figure 19:
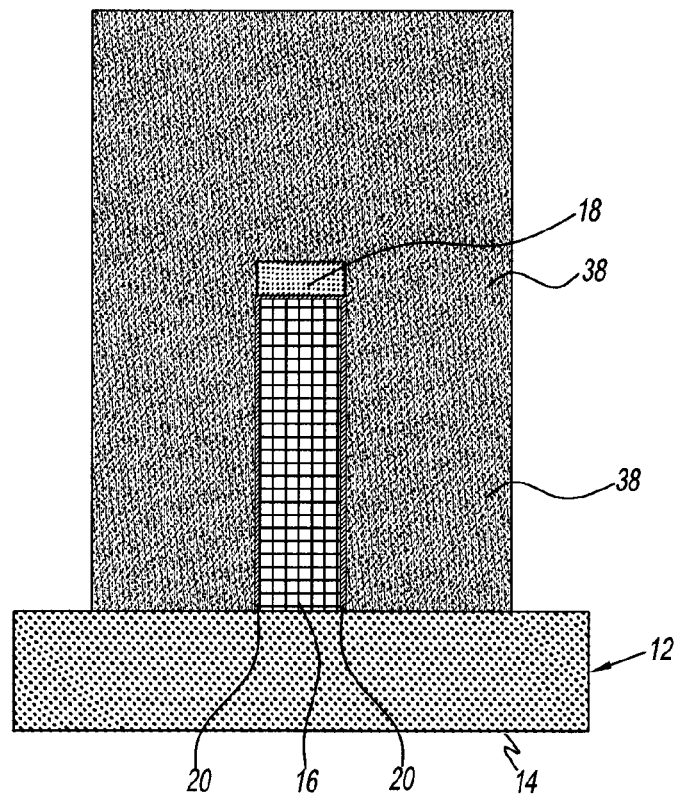
FIG. 19 is a sectional view of FIG. 18, taken along lines 19-19.

Method 10 can then strip cap layer 24 and trimmed mandrel 32 during removing step 150 to leave fin structure 12 with dummy gate 38 as seen in FIGS. 18 and 19. In the illustrated embodiment, fin 16 extends from silicon dioxide layer 14 in a substantially orthogonal direction. Similarly, dummy gates 38 extend from fin 16 and silicon dioxide layer 14 in a substantially orthogonal direction. Of course, it is contemplated by the present disclosure for method 10 to plate dummy gate 38 having any desired orientation with respect to silicon dioxide layer 14 and/or fin 16.

Next, method 10 replaces dummy gate 38 with a gate conductor 42 in the replacement step 160 as shown in FIGS. 20 through 27.

Figure 20:
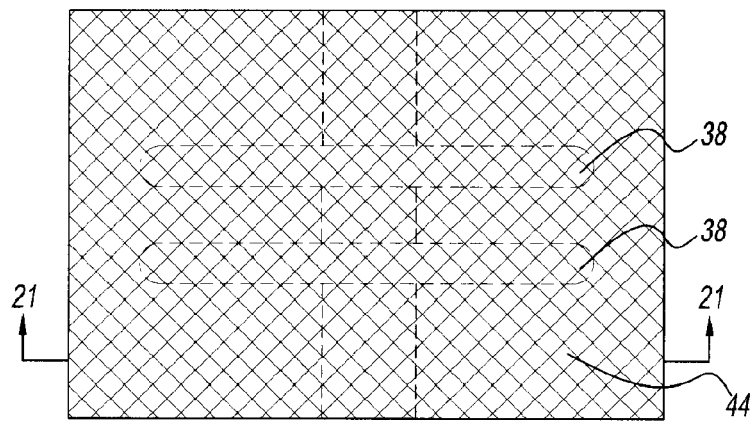
FIG. 20 is a top view of the fin structure after coating with an nitride layer.
Figure 21:
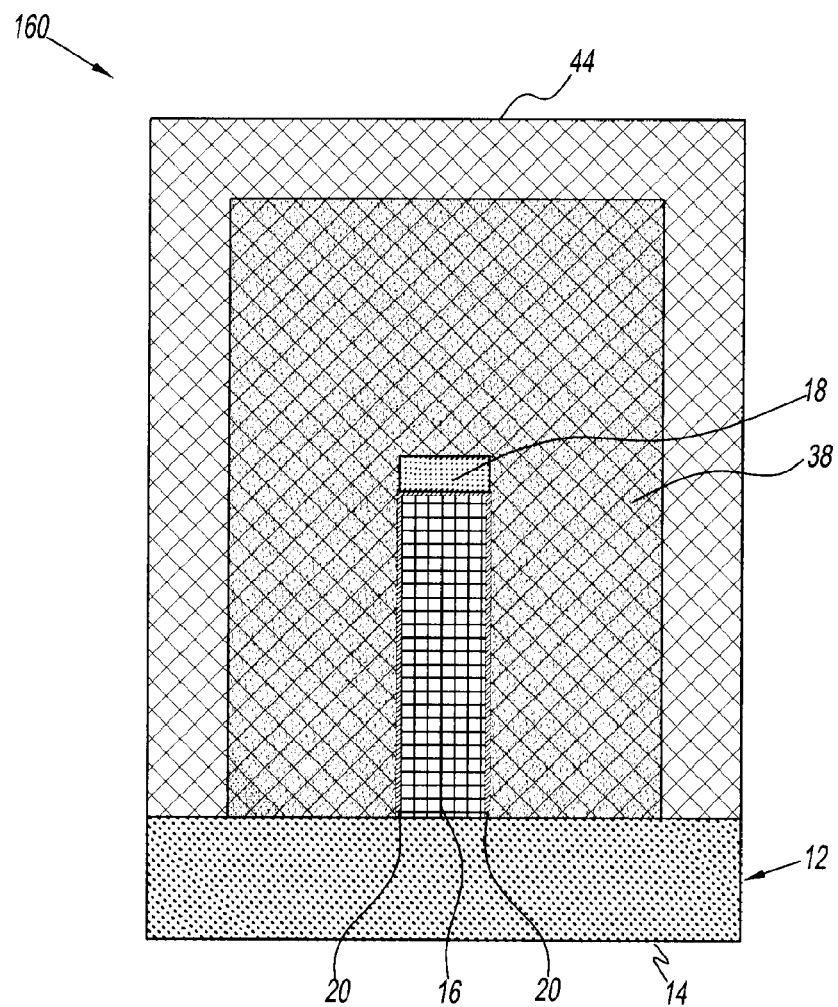
FIG. 21 is a sectional view of FIG. 20, taken along lines 21-21.
Figure 22:
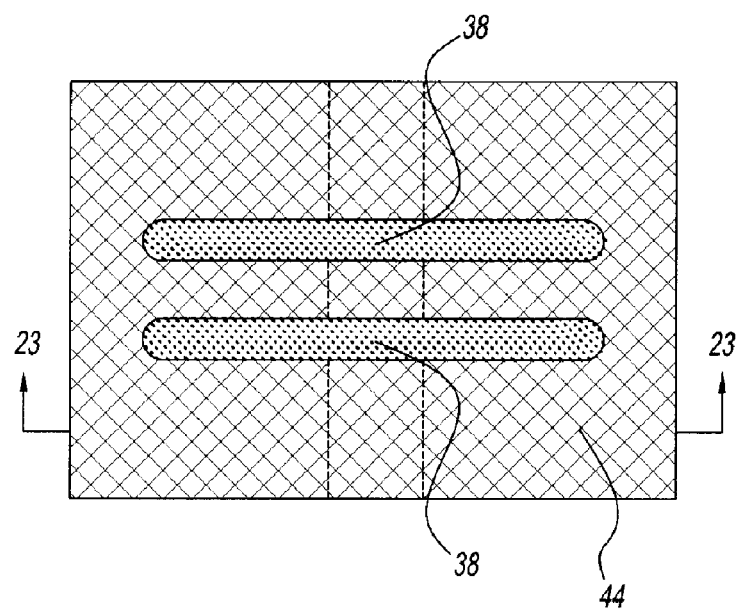
FIG. 22 is a top view of the fin structure after polishing the nitride layer to open the top of the dummy gate conductor.
Figure 23:
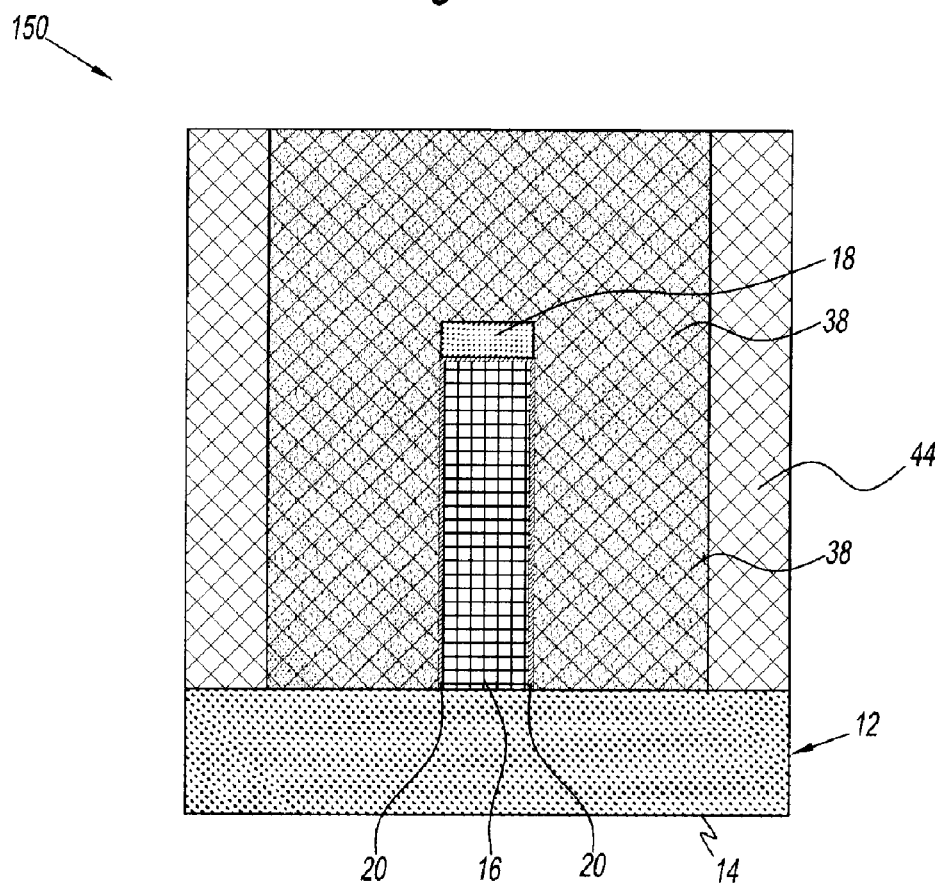
FIG. 23 is a sectional view of FIG. 22, taken along lines 23-23.
Figure 24:
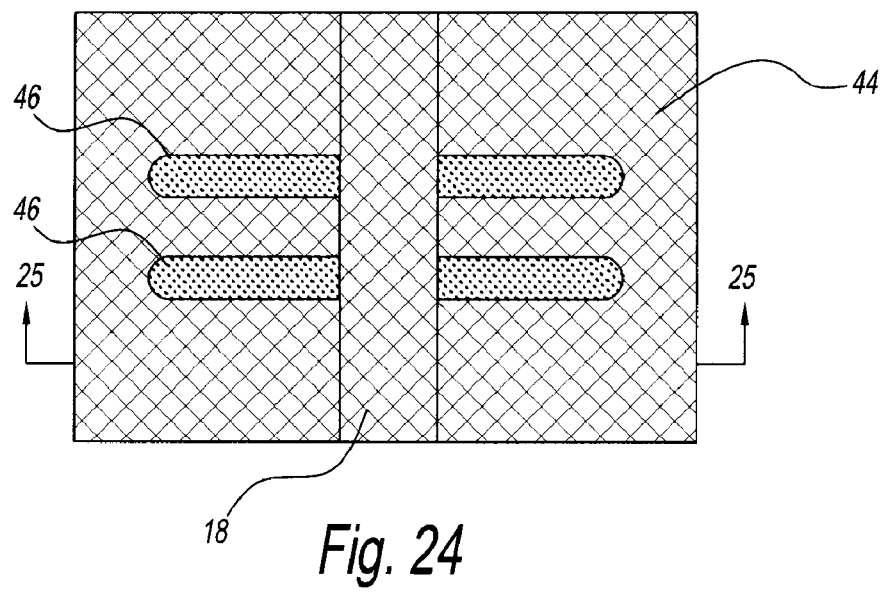
FIG. 24 is a top view of the fin structure after removal of the dummy gate conductor.
Figure 25:
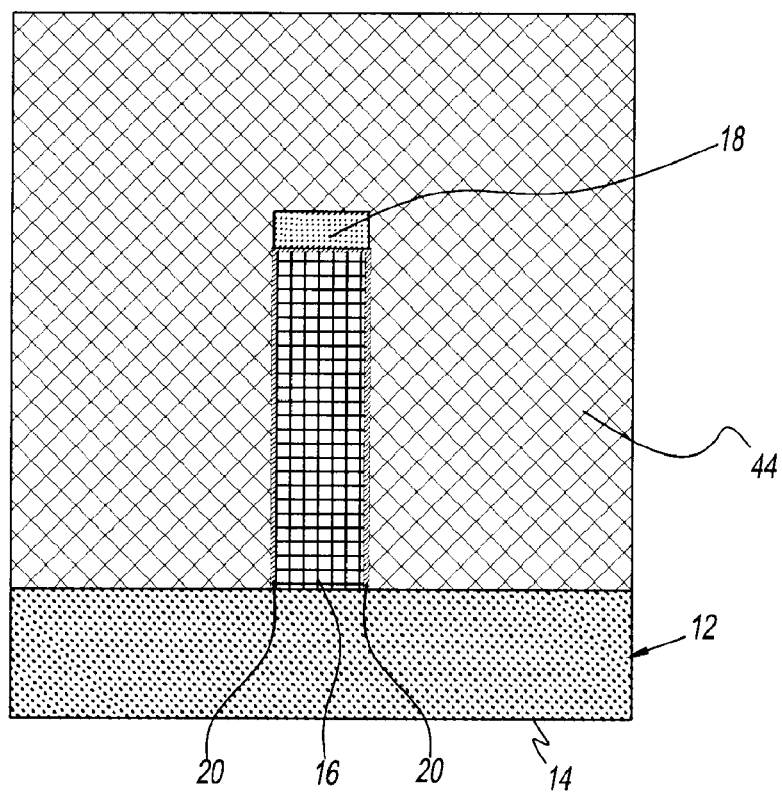
FIG. 25 is a sectional view of FIG. 24, taken along lines 25-25.
Figure 26:
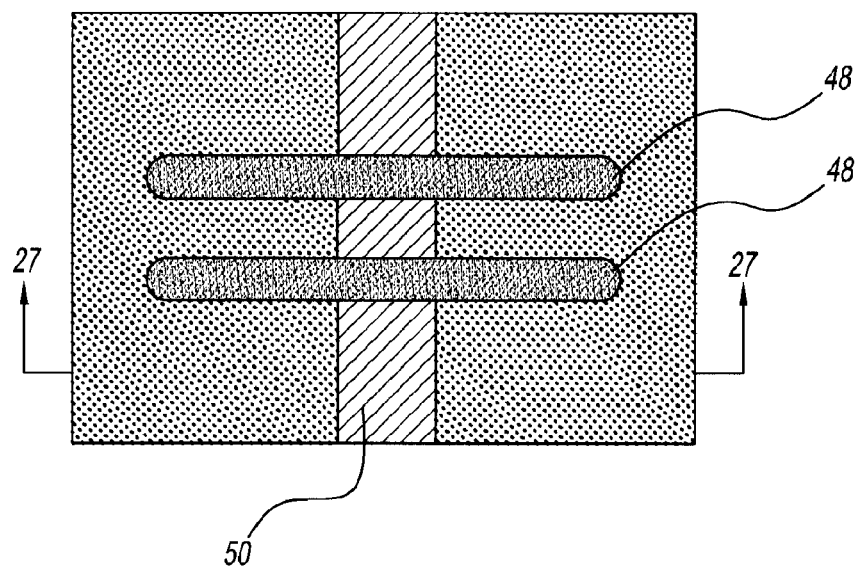
FIG. 26 is a top view of the fin structure after formation of gate dielectric, gate conductor, and source and drain diffusions of finFETs.
Figure 27:
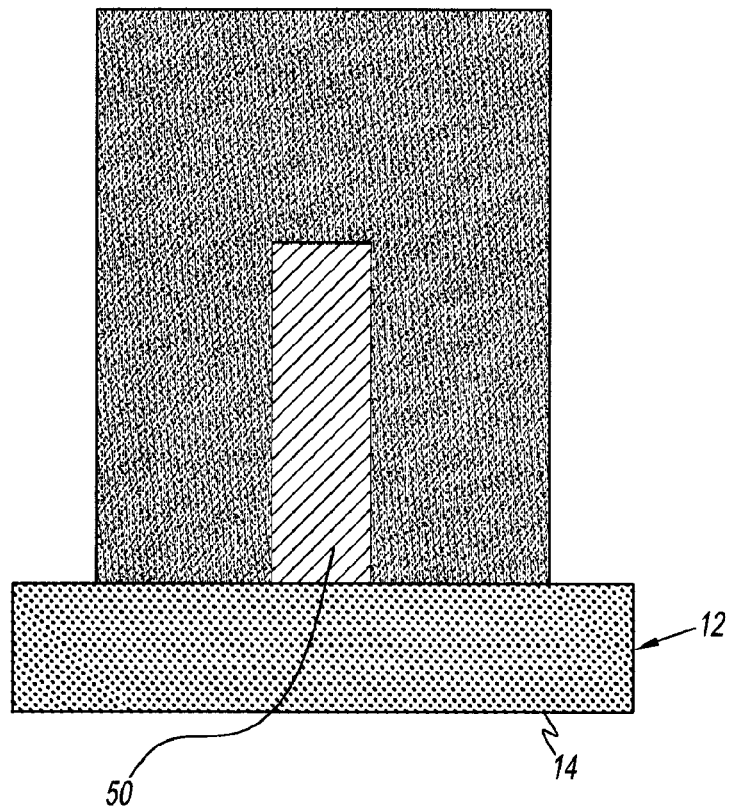
FIG. 27 is a sectional view of FIG. 26, taken along lines 26-26.

During replacement step 160, method 10 applies a silicon nitride layer 44 to fin structure 12 as seen in FIGS. 20 and 21. Next, method 10 polishes silicon nitride layer 44 to reveal dummy gate 38 as seen in FIGS. 22 and 23. Then, method 10 strips dummy gate 38 from silicon nitride layer 44 to reveal a gate-shaped area 46 as seen in FIGS. 24 and 25. In the embodiment illustrated, method 10 reveals two gate-shaped areas 46. After dummy gate 38 and sacrificial oxide 20 are removed, gate dielectric 48 is formed. Gate dielectric 48 may be thermally grown oxynitride, plasma nitridized thermal oxide or CVD deposited material such as, but not limited to hafnium silicate. Finally, method 10 fills gate-shaped areas 46 with doped or undoped polycrystalline silicon (polysilicon) 42 by CVD, and polysilicon 42 is removed by CMP from the top of silicon nitride layer 44. Silicon nitride layer 44 is then removed.

Once method 10 has removed silicon nitride 44, the fin structure can be further processed into any desired device such as, but not limited to, a NFET and, a PFET. During seventh step 170, source and drain regions 50 (shown in FIG. 27) are implanted by angled ion implantations with an appropriate photo resist mask to block the opposite polarity device area. The same dopants may also be implanted into the polysilicon gate at the same time.

Method 10 includes annealing step 180 activate dopants in source, drain, and gate polysilicon. For example, fin structure 12 can be annealed using a laser annealing process or a rapid thermal anneal at a temperature between about 900 and about 1150 degrees Celsius for a range of about 10 microseconds to about 10 seconds.

Gate dielectric 48 can be high-k material, which may be unstable at high temperatures, such as hafnium oxide, zirconium oxide. Also, gate conductor 42 can be non-refractory metal. When these non-refractory materials are used for gate dielectric 48 or gate conductor 42, the source drain implant may be performed after the mandrel and seed layer removal, and the high temperature source and drain activation anneal may be performed right after the dummy gate removal.

In some embodiments, method 10 can form gate dielectric 48 in gate-shaped area 46 prior to the dummy gate formation process.

After annealing step 180, well known process steps can be used to form silicide over source, drain and gate, deposit insulator, form contacts, wirings, and the like to complete the ULSI chip manufacturing.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A method of providing a gate conductor on a semiconductor, comprising:
    defining an organic polymer plating mandrel on the semiconductor;
    activating one or more sites of said organic polymer plating mandrel;
    binding a seed layer to said one or more sites;
    plating a dummy gate to said seed layer, said dummy gate defining a location for the gate conductor; and
    trimming said organic polymer plating mandrel after activating said one or more sites.

2. The method of claim 1, further comprising removing said organic polymer plating mandrel from the semiconductor.

3. The method of claim 2, further comprising replacing said dummy gate with the gate conductor after removing said organic polymer plating mandrel from the semiconductor.

4. A method of providing a gate conductor on a fin structure, comprising:
    defining an organic polymer mandrel over the fin structure;
    activating a plurality of sites of said organic polymer mandrel;
    binding a plating seed layer to said plurality of sites;
    plating a dummy gate on said plating seed layer, said dummy gate defining a location for the gate conductor;
    replacing the dummy gate with the gate conductor;

etching said organic polymer mandrel to define a patterned mandrel prior to activating said plurality of sites; and trimming said patterned mandrel after activating said plurality of sites.

5. The method of claim 4, wherein defining the organic polymer mandrel comprises spin coating the fin structure with a solution of solvent and organic polymer and baking the coated fin structure to remove the solvent.

6. The method of claim 4, wherein activating the plurality of sites comprises treating said organic polymer mandrel with an agent selected from the group consisting of ammonia plasma, oxygen plasma, sulfuric acid, peroxide wet acid, amine, and polyfunctional amine.

7. The method of claim 4, wherein trimming said patterned mandrel after activating said plurality of sites defines one or more portions of said patterned mandrel lacking said plurality of sites.

8. The method of claim 4, wherein said plurality of sites comprise a plurality of amine reactive sites and wherein binding said plating seed layer comprises dipping the fin structure in an aqueous platinum chloride solution and exposing the fin structure to hydrogen gas so that platinum species in said aqueous platinum chloride solution bind to said plurality of amine reactive sites.

9. The method of claim 4, further comprising removing said organic polymer mandrel from the semiconductor prior to replacing the dummy gate with the gate conductor.

10. A method of providing a gate conductor on a fin structure, comprising:

defining an organic polymer mandrel over the fin structure;

activating a plurality of sites of said organic polymer mandrel;

binding a plating seed layer to said plurality of sites;

plating a dummy gate on said plating seed layer, said dummy gate defining a location for the gate conductor; and replacing the dummy gate with the gate conductor, wherein said plurality of sites comprise a plurality of amine reactive sites and wherein binding said plating seed layer comprises dipping the fin structure in an aqueous platinum chloride solution and exposing the fin structure to hydrogen gas so that platinum species in said aqueous platinum chloride solution bind to said plurality of amine reactive sites.

11. The method of claim 10, wherein defining the organic polymer mandrel comprises spin coating the fin structure with a solution of solvent and organic polymer and baking the coated fin structure to remove the solvent.

12. The method of claim 10, wherein activating the plurality of sites comprises treating said organic polymer mandrel with an agent selected from the group consisting of ammonia plasma, oxygen plasma, sulfuric acid, peroxide wet acid, amine, and polyfunctional amine.

13. The method of claim 10, further comprising etching said organic polymer mandrel to define a patterned mandrel prior to activating said plurality of sites.

14. The method of claim 13, further comprising trimming said patterned mandrel after activating said plurality of sites.

15. The method of claim 14, wherein trimming said patterned mandrel after activating said plurality of sites defines one or more portions of said patterned mandrel lacking said plurality of sites.

16. The method of claim 10, further comprising removing said organic polymer mandrel from the semiconductor prior to replacing the dummy gate with the gate conductor.

* * * * *